US009696619B2

(12) United States Patent
Satake et al.

(10) Patent No.: US 9,696,619 B2
(45) Date of Patent: Jul. 4, 2017

(54) TECHNIQUE FOR REPAIRING A REFLECTIVE PHOTO-MASK

(71) Applicant: Dino Technology Acquisition LLC, Milpitas, CA (US)

(72) Inventors: Masaki Satake, Cupertino, CA (US); Ying Li, San Jose, CA (US)

(73) Assignee: Dino Technology Acquisition LLC, Milpitas, CA (US)

( * ) Notice: Subject to any disclaimer, the term of this patent is extended or adjusted under 35 U.S.C. 154(b) by 142 days.

(21) Appl. No.: 14/644,509

(22) Filed: Mar. 11, 2015

(65) Prior Publication Data

US 2015/0185601 A1  Jul. 2, 2015

Related U.S. Application Data

(63) Continuation of application No. 13/764,517, filed on Feb. 11, 2013, now Pat. No. 9,005,852.

(Continued)

(51) Int. Cl.
*G03F 1/72* (2012.01)
*G03F 1/24* (2012.01)
(Continued)

(52) U.S. Cl.
CPC .................. *G03F 1/52* (2013.01); *G03F 1/00* (2013.01); *G03F 1/24* (2013.01); *G03F 1/72* (2013.01); *G06F 17/5068* (2013.01)

(58) Field of Classification Search
CPC ................. G03F 1/24; G03F 1/72; G03F 1/22
See application file for complete search history.

(56) References Cited

U.S. PATENT DOCUMENTS 5,640,199 A   6/1997  Garakani et al.
6,042,998 A   3/2000  Brueck et al.
(Continued)

FOREIGN PATENT DOCUMENTS

DE   102007028172 B3   11/2008
JP   2009010373          1/2009
(Continued)

OTHER PUBLICATIONS

"U.S. Appl. No. 13/746,517, Notice of Allowance mailed Dec. 12, 2014", 5 pgs.

(Continued)

*Primary Examiner* — Stephen Rosasco
(74) *Attorney, Agent, or Firm* — Kwan & Olynick LLP

(57) ABSTRACT

During a calculation technique, a modification to a reflective photo-mask is calculated. In particular, using information specifying a defect associated with a location on a top surface of the reflective photo-mask, the modification to the reflective photo-mask is calculated. For example, the calculation may involve an inverse optical calculation in which a difference between a pattern associated with the reflective photo-mask at an image plane in a photo-lithographic process and a reference pattern at the image plane in the photo-lithographic process is used to calculate the modification at an object plane in the photo-lithographic process. Note that the modification includes a material added to the top surface of the reflective photo-mask using an additive fabrication process. Moreover, the modification is proximate to the location.

16 Claims, 11 Drawing Sheets

Related U.S. Application Data

(60) Provisional application No. 61/699,097, filed on Sep. 10, 2012.

(51) Int. Cl.
G03F 1/52 (2012.01)
G06F 17/50 (2006.01)
G03F 1/00 (2012.01)

(56) References Cited

U.S. PATENT DOCUMENTS

| | | |
|---|---|---|
| 6,235,434 B1 | 5/2001 | Sweeney et al. |
| 6,277,526 B1 * | 8/2001 | Yang ............... G03F 1/72 204/192.35 |
| 6,480,285 B1 | 11/2002 | Hill |
| 6,484,306 B1 | 11/2002 | Bokor et al. |
| 6,563,566 B2 | 5/2003 | Rosenbluth et al. |
| 6,709,792 B2 | 3/2004 | Nakao |
| 6,871,337 B2 | 3/2005 | Socha |
| 6,873,720 B2 | 3/2005 | Cai et al. |
| 6,925,202 B2 | 8/2005 | Karklin et al. |
| 7,003,755 B2 | 2/2006 | Pang et al. |
| 7,043,071 B2 | 5/2006 | Qian et al. |
| 7,057,709 B2 | 6/2006 | Rosenbluth |
| 7,073,162 B2 | 7/2006 | Cobb et al. |
| 7,093,226 B2 | 8/2006 | Pang |
| 7,093,229 B2 | 8/2006 | Pang et al. |
| 7,107,573 B2 | 9/2006 | Yamazoe et al. |
| 7,124,394 B1 | 10/2006 | Abrams et al. |
| 7,152,219 B2 | 12/2006 | Pang |
| 7,178,127 B2 | 2/2007 | Abrams et al. |
| 7,231,628 B2 | 6/2007 | Pack et al. |
| 7,254,251 B2 | 8/2007 | Cai et al. |
| 7,302,090 B2 | 11/2007 | Kalus et al. |
| 7,363,611 B2 | 4/2008 | Rosenbluth |
| 7,376,512 B2 | 5/2008 | Hirscher et al. |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,646,906 B2 | 1/2010 | Saidin et al. |
| 7,676,077 B2 | 3/2010 | Kulkarni et al. |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,142,958 B2 | 3/2012 | Holfeld |
| 8,200,002 B2 | 6/2012 | Preil et al. |
| 8,204,295 B2 | 6/2012 | Preil et al. |
| 8,208,712 B2 | 6/2012 | Preil et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 8,386,968 B2 | 2/2013 | Pang |
| 8,458,622 B2 | 6/2013 | Pang et al. |
| 8,463,016 B2 | 6/2013 | Pang |
| 8,555,214 B2 | 10/2013 | Clifford |
| 8,612,903 B2 | 12/2013 | Pang et al. |
| 8,644,588 B2 | 2/2014 | Preil et al. |
| 9,005,852 B2 | 4/2015 | Satake et al. |
| 2002/0192578 A1 | 12/2002 | Tanaka et al. |
| 2003/0103189 A1 | 6/2003 | Neureuther et al. |
| 2003/0106642 A1 | 6/2003 | Fairbairn et al. |
| 2004/0008880 A1 | 1/2004 | Horie et al. |
| 2004/0265707 A1 | 12/2004 | Socha |
| 2005/0122500 A1 | 6/2005 | Ye et al. |
| 2005/0168498 A1 | 8/2005 | Granik |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0273242 A1 | 12/2006 | Hunsche et al. |
| 2007/0105029 A1 | 5/2007 | Ausschnitt |
| 2007/0133862 A1 | 6/2007 | Gold et al. |
| 2007/0198963 A1 | 8/2007 | Granik et al. |
| 2008/0152212 A1 | 6/2008 | Feldman |
| 2008/0170774 A1 | 7/2008 | Xiong et al. |
| 2008/0198350 A1 | 8/2008 | Sugita et al. |
| 2008/0241708 A1 | 10/2008 | Lin et al. |
| 2008/0318138 A1 | 12/2008 | Holfeld |
| 2010/0092876 A1 * | 4/2010 | Kanamitsu ............ G03F 1/84 430/5 |
| 2010/0135568 A1 | 6/2010 | Preil et al. |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066651 A1 | 3/2012 | Pang et al. |
| 2012/0066652 A1 | 3/2012 | Clifford |
| 2012/0134542 A1 | 5/2012 | Pang et al. |
| 2012/0137260 A1 | 5/2012 | Pang |
| 2012/0189187 A9 | 7/2012 | Preil et al. |
| 2014/0072903 A1 | 3/2014 | Satake et al. |

FOREIGN PATENT DOCUMENTS

| | | |
|---|---|---|
| WO | 2005078528 A2 | 8/2005 |
| WO | 2005078528 A3 | 8/2005 |
| WO | 2008039674 A2 | 4/2008 |
| WO | 2008039674 A3 | 6/2008 |

OTHER PUBLICATIONS

"U.S. Appl. No. 13/764,517, Non Final Office Action mailed Jul. 3, 2014", 6 pgs.

"International Application No. 2007/078913, Written Opinion mailed Mar. 25, 2008", Mar. 25, 2008, 6 pgs.

Abrams, Daniel S. et al., "Fast Inverse Lithography Technology", Optical Microlithography XIX, Proc. of SPIE vol. 6154 61541J, 2006, 10 pgs.

Chen, C.Y. et al., "Mask defect auto disposition based on aerial image in mask product", Proc. SPIE 7379, 73791F, 2009, 11 pgs.

Granik, Y , "Solving Inverse Problems of Optical Microlithography", Proc. SPIE col. 5754, Optical Microlithography XVIII, May 12, 2005, 506-526.

Khan, M et al., "A Semi-Empirical Resist Dissolution Model for Sub-micron Lithographies", Technical Proceedings of the 1998 International Conference on Modeling and Simulation of Microsystems, 1998, 41-46.

Pang, et al., "Considering MEEF in Inverse Lithography Technology (ILT) and Source Mask Optimization (SMO)", SPIE, vol. 7122, Oct. 17, 2008, 14 pgs.

Pang, L et al., "Computational Lithography & Inspection (CLI) and its Applications in Mask Inspection, Metrology, Review and Repair", Luminescent Technologies In., Palo Alto CA, Sep. 28, 2010, 18 pgs.

Pang, L et al., "Full Chip Scale Source Mask Optimazation (SMO) Implementation through Leval Set Methods based Inverse Lithography Technology (ILT) Framework", Luminescent Litho Workshop 2009 Abstract vJMI, Apr. 29, 2009, 2 pgs.

Rosenbluth, et al., "Optimum Mask and Source Patterns to Print Given Shape", SPIE Proceedings vol. 4346, Apr. 2002, 13-30.

(56) References Cited

OTHER PUBLICATIONS

Sethian, J.A. et al., "An Overview of Level Set Methods for Etching, Deposition, and Lithography Development", IEEE Tran. on Semiconductor Manufacturing, vol. 10, No. 1, Jan. 8, 1996, 1-30.
Xiao, et al., "Source Optimization and Mask Design to Minimize MEEF in Low k, Lithography", SPIE, vol. 7028, Jun. 9, 2008, 11 pgs.

\* cited by examiner ic # TECHNIQUE FOR REPAIRING A REFLECTIVE PHOTO-MASK

CROSS REFERENCE TO RELATED APPLICATIONS

This application is a continuation and claims priority of U.S. patent application Ser. No. 13/764,517, entitled "Technique for Repairing a Reflective Photo-Mask", filed Feb. 11, 2013 by Masaki Satake and Ying Li, which claims priority under 35 U.S.C. §119(e) to U.S. Provisional Application Ser. No. 61/699,097, entitled "Technique for Repairing a Reflective PhotoMask," by Masaki Satake and Ying Li, filed on Sep. 10, 2012, and is related to U.S. Non-provisional application Ser. No. 13/021,591 filed on Feb. 4, 2011, now U.S. Pat. No. 8,555,214 issued Oct. 8, 2013 and to U.S. Non-provisional application Ser. No. 13/024,233 filed on Feb. 9, 2011, now U.S. Pat. No. 8,612,903 issued Dec. 17, 2013. These applications and patents are herein incorporated by reference in their entirety.

BACKGROUND OF THE INVENTION

Field of the Invention

The present invention relates to techniques for repairing a photo-mask. More specifically, the invention relates to techniques for calculating a modification to a reflective photo-mask (which is to be used in a photolithographic process) and/or for repairing the photo-mask using an additive process.

Related Art

Photolithography is a widely used technology for producing integrated circuits. In this technique, a light source illuminates a photo-mask. The resulting spatially varying light pattern is projected onto a photoresist layer on a semiconductor wafer by an optical system (which is referred to as an 'exposure tool'). By developing the 3-dimensional pattern produced in this photoresist layer (which is sometimes referred to as a 'target pattern'), a layer in the integrated circuit is created. Furthermore, because there are often multiple layers in a typical integrated circuit, these operations may be repeated using several photo-masks to produce a product wafer.

In order to appropriately scale to smaller critical dimensions in integrated circuits (and, thus, to reduce diffraction and proximity effects that occur when light is propagated through the optics of the exposure tool and is converted into the 3-dimensional pattern in the photoresist), commensurately smaller wavelengths of light may be provided by the light source. However, it is difficult to design and manufacture transmission photo-masks at small wavelengths, such as in the extreme ultra-violet.

Recently, reflective photo-masks have been investigated for use with wavelengths in the extreme ultra-violet. In a reflective photo-mask, a multilayer stack is used to reflect the light from the light source. For example, multiple alternating layers of silicon and molybdenum may be deposited on silicon or a glass substrate having an ultra-low thermal expansion coefficient (such as quartz). Then, the mask pattern may be defined in an absorption layer (such as tantalum nitride) that is deposited on top of the multilayer stack.

In practical reflecting photo-masks, up to 80 alternating layers are used. Furthermore, these layers may have thicknesses as small as 2-4 nm. However, this structure can be difficult to manufacture. For example, during the manufacturing process defects can occur throughout the multilayer stack. It can be difficult to detect the presence of a defect in the multilayer stack without performing destructive analysis. In addition, even if a defect is detected (or when a type of defect is probable in a given manufacturing process), it is often difficult (or impossible) to predict the consequences of the defect in the photolithographic process (e.g., will the defect result in an unacceptable change in the 3-dimensional pattern) or to determine how to modify a reflective photo-mask to reduce or eliminate the effect of a defect on the photolithographic process. As a consequence, the inspection and qualification criteria for reflective photo-masks are often needlessly conservative, which results in rejection of reflective photo-masks that could be successfully used in the photolithographic process (i.e., the reflective photo-mask yield may be needlessly reduced), thereby significantly increasing the cost of reflective photo-masks. In addition, it is often difficult to appropriately modify the photo-mask to reduce or eliminate the effect of the defect on the photolithographic process, which also adversely impacts the reflective photo-mask yield, and this also increases the cost of reflective photo-masks.

Hence, what is needed is a reflective photo-mask inspection and qualification technique and a reflective photo-mask repair technique that overcomes the problems listed above.

SUMMARY OF THE INVENTION

The present disclosure relates to a computer system for calculating a modification to a reflective photo-mask. During operation, the computer system receives information specifying a defect associated with a location on a top surface of the reflective photo-mask. Then, the computer system calculates the modification to the reflective photo-mask. This modification includes a material added to the top surface of the reflective photo-mask using an additive fabrication process. Moreover, the modification is proximate to the location.

Note that the calculation may involve an inverse optical calculation in which a difference between a pattern associated with the reflective photo-mask at an image plane in a photo-lithographic process and a reference pattern at the image plane in the photo-lithographic process is used to calculate the modification at an object plane in the photolithographic process.

Moreover, the defect may include a phase error. Furthermore the material may include carbon.

In some embodiments, the receiving involves identifying the defect.

Additionally, in some embodiments the defect includes a pit below a top surface of an absorption laser in the reflective photo-mask (which may include below a top surface of a capping layer or a multilayer stack in the reflective photo-mask, and proximity to the location includes a region above the pit. Alternatively, the defect may include a bump above the top surface of the absorption layer (which may include above a top surface of a capping layer or a multilayer stack in the reflective photo-mask), and proximity to the location may include an annular region at least partially surrounding the bump.

In some embodiments, the modification further includes defining a pattern in the absorption layer using a subtractive fabrication process.

In this way, the modification may increase a margin of the reflective photo-mask in the photo-lithographic process that uses the reflective photo-mask.

Another embodiment provides a method including at least some of the above-described operations.

Another embodiment provides a computer-program product for use in conjunction with the computer system.

Another embodiment provides the modified reflective photo-mask. This reflective photo-mask includes: a substrate; a multilayer stack disposed on the substrate; the absorption layer disposed on a top surface of the multilayer stack; and the material disposed on the reflective photo-mask. This material is proximate to the location on the top surface of the reflective photo-mask that is associated with the defect in the reflective photo-mask.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix; separated from an instance number by a dash.

DETAILED DESCRIPTION OF THE INVENTION

Figure 1:
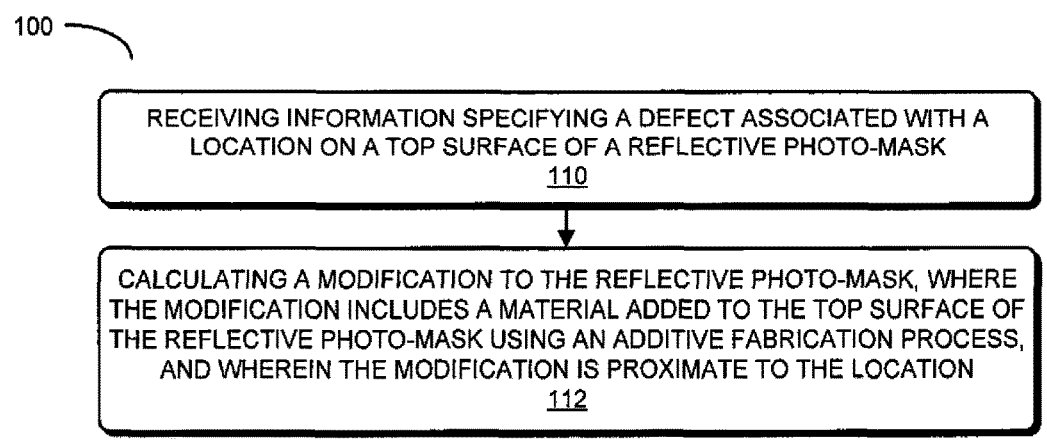
FIG. 1 is a flow chart illustrating a method for calculating a modification, to a reflective photo-mask in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, a computer program product (i.e., software) for use with the computer system are described. These devices and processes may be used to calculate a modification to a reflective photo-mask, which, in turn, can be used to modify or repair one or more defects in the reflective photo-mask. In particular, based on an identified defect in the reflective photo-mask, the modification to the reflective photo-mask is calculated using an inverse optical calculation. In particular, during the inverse optical calculation, a cost function at an image plane in a model of the photolithographic process is used to determine the modification to the reflective photo-mask at object plane in the model of the photolithographic process. This cost function may correspond to a difference between a reference pattern associated with a target mask pattern (such as a reference aerial image or a reference contour at an image plans in the photolithographic process) and a calculated pattern associated with a modified reflective photo-mask (such as art aerial image or a contour at the image plane in the photolithographic process). Note that the modified reflective photo-mask may include the modification to the reflective photo-mask determined in a previous-iteration during the inverse optical calculation.

This calculation technique may provide a last and accurate approach for calculating the reflected light from the multilayer stack. As a consequence, it may be useful in assessing the impact of one or more detects in the multilayer stack in the photolithographic process. For example, the calculated reflected light from the multilayer stack may be used to determine an aerial image at an image plane of an optical path associated with the photolithographic process (such) as the aerial image at a wafer in a exposure tool) and/or an estimated resist pattern. Furthermore, for a given defect, the impact in the aerial image and/or the estimated resist pattern may be determined with different mask patterns to assess which mask patterns can be used with a multilayer stack that includes the given defect, as well as to determine how to modify the reflective photo-mask to repair the given defect. Therefore, the calculation technique may be used to determine an acceptance condition of the reflective photo-mask and/or how to repair the reflective photo-mask, which may allow improved inspection and qualification criteria for reflective photo-masks, with a commensurate impact on reflective-photo-mask yield and cost.

In the discussion that follows, a reflective photo-mask should be understood to include an absorption layer, an alternating phase-shift layer, and/or an attenuating phase-shift layer deposited on a multilayer stack, which in turn is deposited on a substrate. This reflective photo-mask may be used in extreme ultra-violet photolithography. Furthermore, the reflective photo-mask may be used in multiple-exposure photolithography, where patterns printed on a wafer or semiconductor die using two or more reflective photo-masks are combined to produce a desired or target pattern, such as a portion of an integrated circuit. Furthermore, a mask pattern should be understood to include the pattern of spatially varying transmittance magnitude and/or transmittance phase of the absorption layer, the alternating phase-shift layer, and/or the attenuating phase-shift layer deposited on the multilayer stack. Note that, typically, the manufactured or fabricated mask pattern in a given reflective photo-mask may deviate from an ideal target mask pattern, for example, because of defects that can occur during the photo-mask fabrication process. In addition, as described further below, there may be defects in the multilayer stack.

In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these lies may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

Figure 2:
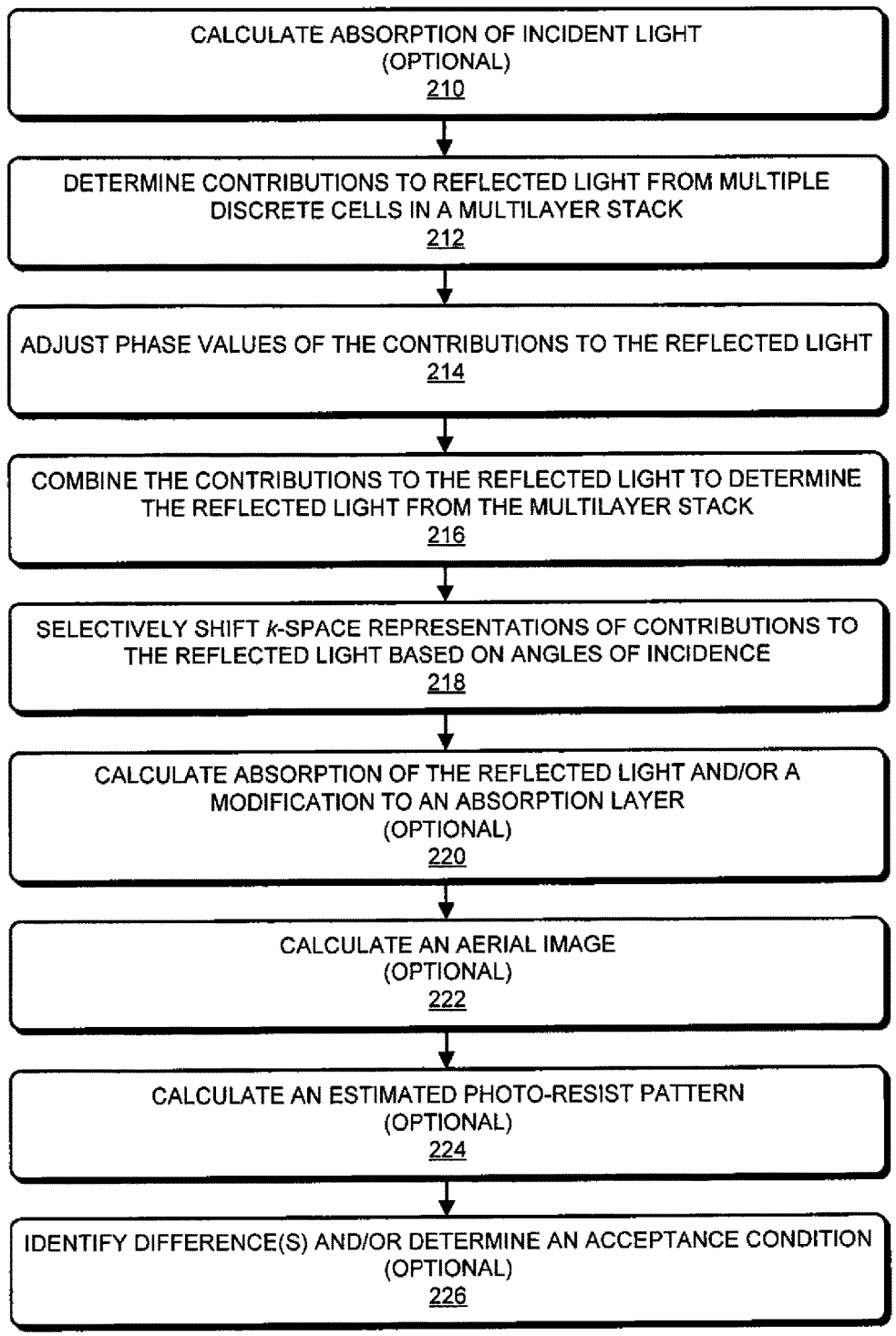
FIG. 2 is a flow chart illustrating a method for calculating reflected light from a multilayer stack in a reflective photo-mask in accordance with an embodiment of the present invention.

We now describe embodiments of the calculation technique. FIG. 1 presents a flow chart illustrating a method 100 for calculating a modification to a reflective photo-mask, which is performed by a computer system (such as computer system 1000 in FIG. 10). During operation, the computer system receives information specifying a defect (such as a phase error) associated with at least a location on a top surface (such as on top of a capping layer and/or an absorption layer) of the reflective photo-mask (operation 110). (However, note that the information about the defect may be more than the location. For example, the information may specify the defect and its impact throughout a multilayer stack in the reflective photo-mask. As described further below with reference to FIG. 2, this information as a function of depth, may be used when computing the modification.) In some embodiments, the receiving (operation 110) involves identifying the defect.

Then, the computer system calculates the modification to the reflective photo-mask (operation 112). For example, as described further below with reference to FIG. 9, the calculation may involve an inverse optical calculation in which a difference between a pattern associated with the reflective photo-mask at an image plane in a photo-lithographic process and a reference pattern at the image plane in the photo-lithographic process is used to calculate the modification at an object plane in the photo-lithographic process. Note that the modification may include a material (such as carbon) added to the top surface of the reflective photo-mask using an additive fabrication process, such as evaporation or sputtering (which is described further below with reference to FIGS. 4 and 5). Moreover, the modification is proximate to the location. As described further below with reference to FIG. 6, in some embodiments the modification further includes defining or changing a pattern in the absorption layer using a subtractive fabrication process, such as photo-lithographic etching, ion milling or e-beam lithography.

Additionally, as described below with reference to FIG. 4, in some embodiments the defect includes a pit below a top surface of the absorption layer in the reflective photo-mask (which may include below a top surface of a capping layer or a multilayer stack in the reflective photo-mask), proximity to the location includes a region above the pit. Alternatively, as described below with reference to FIGS. 5A and 5B, the defect may include a bump above the top surface of the absorption layer (which may include above a top surface of a capping layer or a multilayer stack in the reflective photo-mask), and proximity to the location may include an annular region at least partially surrounding the bump. Note the defect may be defined with respect to the top surface of the absorption layer or with respect to an arbitrary surface in the reflective photo-mask (such as the capping layer, in the multilayer stack and/or on the substrate).

By compensating or correcting for the defect, the modification may increase a margin of the reflective photo-mask in the photo-lithographic process that uses the reflective photo-mask.

In some embodiments of method 100 there may be additional or fewer operations. Moreover, the order of the operations may be changed, and/or two or more operations may be combined into a single operation.

Calculating the modification to the reflective photo-mask (operation 112) may involve calculating the reflected light from the reflective photo-mask. This is described in FIG. 2, which presents a flow chart illustrating a method 200 for calculating reflected light from a multilayer stack in a reflective photo-mask (such as a reflective photo-mask for use in an extreme ultra-violet range of wavelengths), which is performed by a computer system (such as computer system 1000 in FIG. 10). During operation, the computer system determines contributions to reflected light from multiple discrete cells in a model of the multilayer stack in the reflective photo-mask based on angles of incidence, of light in a light pattern to the multilayer stack, a polarization of the light in the light pattern, and a varying intensity of the light in the light pattern through the multilayer stack (operation 212), where the multiple discrete cells are at horizontal and vertical positions in the multilayer stack, and where the multilayer stack includes at least one defect. Then, the computer system adjusts phase values of the contributions to the reflected light from the multiple discrete cells (operation 214), thereby specifying optical path differences between the multiple discrete cells in the multilayer stack that are associated with the defect. Moreover, the computer system combines the contributions to the reflected light from multiple discrete cells to determine the reflected light from the multilayer stack (operation 216). Next, the computer system selectively shifts k-space representations of the contributions to the reflected light from the multiple discrete cells based on the angles of incidence (operation 218), thereby accounting for phase variations associated with deviations from normal incidence. Note that this approach to handling the variations in the normal orientation may result in a reasonable tradeoff between the speed and the accuracy of the calculation technique (for example, the calculation technique may be four to five-times faster than existing reflected-light calculation techniques, and the accuracy may be 4% for incident light having an angle of incidence up to 9°).

Note that the horizontal and vertical positions may be included in horizontal planes (e.g., x,y planes) in the multilayer stack that are separated by a spacing or a height z. In these embodiments, deviations in vertical positions within the multilayer stack that are associated with the defect may be addressed using the phase values. Furthermore, determining the reflected light from a given discrete cell in the multiple discrete cells may use a closed-form expression for the reflected light. For example, the closed-form expression may treat the given discrete cell as an infinite two-dimensional sheet in the multilayer stack.

In some embodiments, the detect is associated with vertical displacements and/or a change in a thickness of one or more layers in a region in the multilayer stack. More generally, the defect may include a deviation in a magnitude and/or a phase of the reflectance of the reflective photo-mask from that associated with reflective photo-mask that excludes the defect, and which has a target mask pattern defined on its top surface. Thus, the defect may include a hard defect (such as a sputtering-induced bump in at least some of the layers in the multilayer stack), an error in the mask pattern, and/or a soft defect (such as dirt or contamination on the surface of the reflective photo-mask).

Additionally, for a given discrete cell, the varying intensity of the light pattern through the multilayer stack may involve calculating cumulative rejection and absorption by intervening discrete cells between the given discrete cell and a top surface of the multilayer stack.

In some embodiments, prior to determining the contributions to the reflected light from the multiple discrete cells, the computer system optionally calculates absorption of incident light to the reflective photo-mask by the absorption layer in the model (operation 210), which is deposited on the multilayer stack in the reflective photo-mask, thereby determining the light pattern incident to the multilayer stack, where the absorption layer includes a mask pattern of the reflective photo-mask. Note that the incident light may be represented by a plane wave and/or the light pattern may include a near-field diffraction pattern associated with the mask pattern. Furthermore, after combining the contributions to the reflected light from multiple discrete cells, the computer system may optionally calculate absorption of the reflected light from the reflective photo-mask by the absorption layer (operation 220), thereby calculating reflected light from the reflective photo-mask. In some embodiments, the computer system calculates a modification to the multilayer stack based on the defect (operation 220). For example, the computer system may change a thickness of the absorption layer and/or may modify a two-dimensional pattern of the absorption layer (which collectively are sometimes referred to as 'multilayer defect compensation'). Alternatively or additionally, the computer system may selectively add a layer of the material having a thickness on a top surface of the reflective photo-mask proximate to the location of the defect.

Additionally, the computer system may optionally calculate an aerial image at an image plane of an optical path in a photolithographic process using a forward optical calculation based on the reflected light from the reflective photo-mask, information about the optical path in the photolithographic process and conditions associated with the photolithographic process (operation 222). For example, the forward optical calculation may be based on the information about the optical path associated with an imaging system (such as an exposure tool) that is used in the photolithographic process. Note that the conditions associated with the photolithographic process may include: immersion optics, a source pattern (for example, an annular, quadrupole, disk illumination with a sigma of 0.75, and/or a pixilated source pattern), a numerical aperture of 0.32 or 0.67, a wavelength of 13.5 nm, etc.

In some embodiments, the computer system optionally calculates an estimated resist pattern based on the aerial image and a model of a photoresist (such as a model of a positive or a negative resist) in the photolithographic process operation 224). Note that one or more aerial images and/or estimated photoresist patterns may be determined using a variety or a range of imaging conditions, such as: different wavelengths, different focal conditions, different illumination types (such as annular, quadrupole, immersion, etc.), etc. Furthermore, the computer system may optionally identify differences between the estimated resist pattern and a target pattern (or differences between the aerial image and the target pattern), and/or the computer system may optionally determine an acceptance condition of the reflective photo-mask based on the identified differences (operation 226).

For example, a photo-mask qualifier may analyze the aerial image and/or the estimated resist pattern to determine if it is acceptable, e.g., if differences with respect to the target pattern and/or any deviations that are present are within acceptable bounds, such as a fraction of a critical dimension in the target pattern. (In embodiments where the aerial image is used instead of the estimated photoresist pattern, this may involve prior correlation with the critical dimension(s) of a test wafer.) If yes, the reflective photo-mask may be accepted, and if not, the reflective photo-mask may be: rejected, subject to rework, or subject to additional qualification testing.

In some embodiments, the reflective photo-mask is accepted (or not) based on a process window (such as a range of exposure times, a depth of focus, a range of exposure intensifies, and/or a normalized image log slope) associated with the photolithographic process. In this way, a particular defect that is fatal when slightly overexposed may be identified, even though it is negligible at the nominal dose. In addition, in some embodiments the reflective photo-mask is accepted (or not) based on features in the aerial image and/or the estimated resist pattern that are identified over or throughout the process window and/or based on an impact on a critical dimension across the process window. Note that acceptance of the reflective photo-mask may be fully automated, while in other embodiments it may not be fully automated. Thus, information (such as identified differences or features) may be presented to an operator, who may verify an acceptance recommendation made by the computer system (such as a reflective photo-mask inspection and qualification system) or who may independently determine whether or not to accept the reflective photo-mask.

Alternatively or additionally, the reflective photo-mask may be qualified based on comparisons between the estimated resist pattern and actual patterned wafer patterns produced or generated using a reflective photo-mask. For example a wafer-exposure system, (such as a photolithographic exposure tool) may be used to produce a printed wafer using the reflective photo-mask, and a printed wafer image of the pattern on the printed wafer may be determined using a wafer-imaging system (such as the PUMA™ patterned wafer-inspection platform from KLA-Tencor, Inc., of San Jose, Calif.). However, this brute-force approach is often expensive and time consuming. In addition, errors introduced in the photolithographic process in the wafer-exposure system may reduce the accuracy of the qualification decision made by the computer system.

Thus, the calculation technique may overcome the limitations in existing reflective photo-mask inspection and qualification for example, by providing a low-cost and efficient technique for determining whether or not a reflective photo-mask (including any defects) is acceptable. In addition, the modification computed using the calculation technique may be used to repair a reflective photo-mask. Therefore, the calculation technique may improve reflective photo-mask and/or wafer yield, and thus may decrease the cost and time to market of reflective photo-masks and integrated circuits.

In some embodiments of method 200 there may be additional or fewer operations. Moreover, the order of the operations may be changed, and/or two or more operations may be combined into a single operation. For example, in some embodiments ray tracing is used to account for the divergence or spreading of contributions to the reflected light that are associated with at least the defect. Furthermore, in some embodiments horizontal sampling (such as the size of the discrete cells in a horizontal plane) across the multilayer stack is varied based on a relative position with respect to at least the defect so that the horizontal sampling is increased in proximity to the defect and is decreased distal from the defect. Thus, coarse and fine horizontal sampling may be used in the calculation technique.

Figure 3:
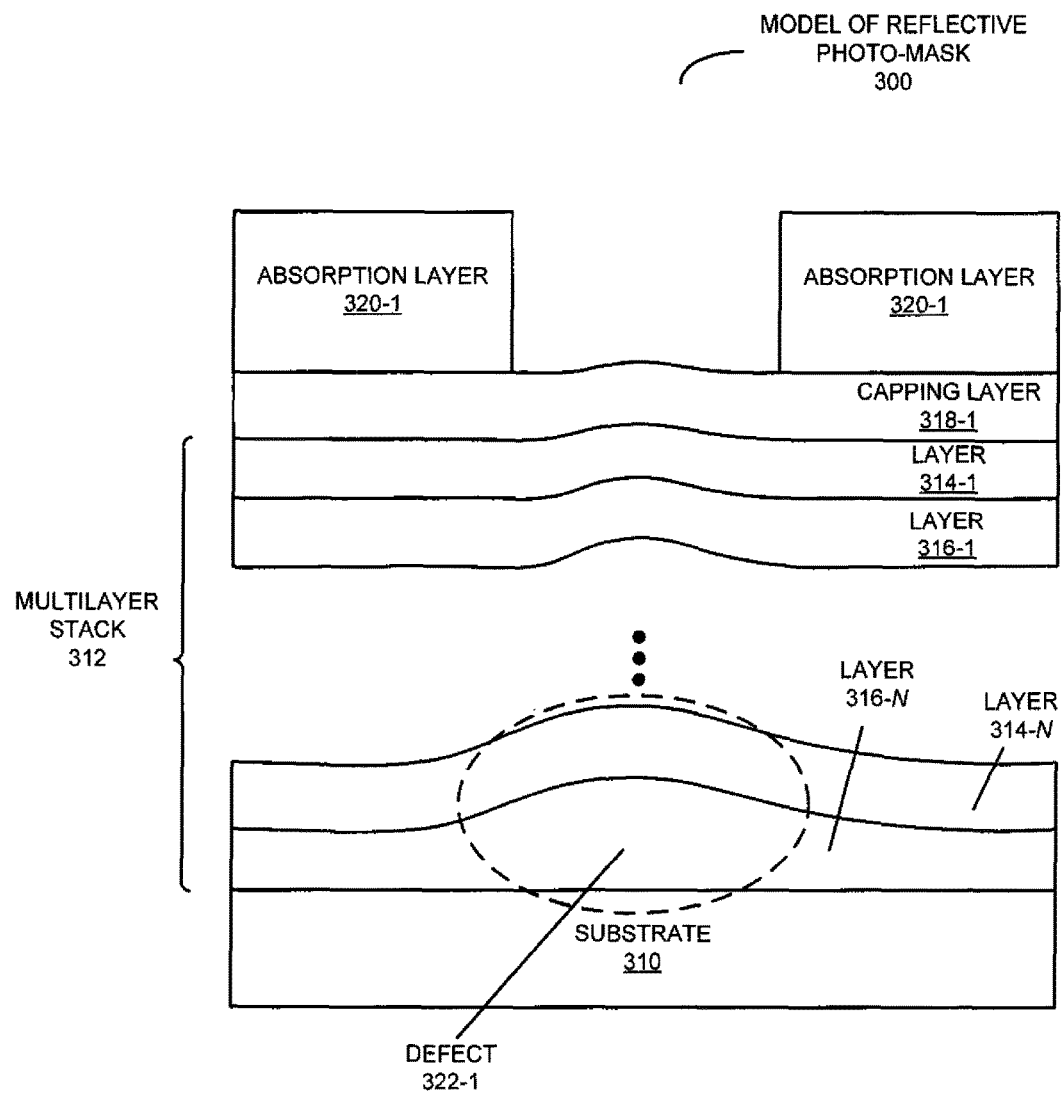
FIG. 3 is a block diagram illustrating a model of a reflective photo-mask in accordance with an embodiment of the present invention.

In an exemplary embodiment, the calculation technique is used to determine the reflected light from a model of a reflective photo-mask that includes at least one defect. This is shown in FIG. 3, which presents a block diagram illustrating a model of a reflective photo-mask 300. In this model of reflective photo-mask 300, a multilayer stack 312 is deposited on a substrate 310 (such as silicon or quartz). Note that multilayer stack 312 includes alternating layers 314 and 316. For example, these layers may, respectively, include silicon and molybdenum, and may, respectively, have thicknesses of 4 nm and 2 nm. In some embodiments, there are 40 instances of alternating layers 314 and 316 (or 80 layers in total). Note that in the model, each of layers 314 and 316 may be subdivided into multiple discrete cells (not shown).

Furthermore, a capping layer 318 (such as ruthenium) may be deposited onto multilayer stack 312. Additionally, an absorption layer 320-1 (such as tantalum nitride) may be deposited on top of capping layer 318, and this absorption layer 320-1 may be patterned (for example, using electron-beam lithography) to define the two-dimensional mask pattern.

The model of reflective photo-mask 300 may include a defect 322-1, such as one associated with a fabrication process. For example, the model of reflective photo-mask 300 may correspond to a reflective photo-mask that is fabricated using a sputtering process, and a buried defect, such as a 'bump' or change in vertical position, may occur between substrate 310 and multilayer stack 312 and/or between layers in multilayer stack 312. In some embodiments, defect 322-1 has a height of 15 nm, which results in a 1.5 nm vertical deviation or displacement at a surface of multilayer stack 312. In other embodiments, defect 322-1 has a height between 2-5 nm and a width of 50 nm.

Note that defect 322-1, whose impact on the aerial image and/or the estimated photo-resist pattern can be studied using the calculation technique, may be identified in a reflective photo-mask (for example, using micro-analysis) or it may be known that a manufacturing process used to fabricate the reflective photo-mask may be vulnerable to a type of defect, such as defect 322-1.

In some embodiments, the reflected light associated with the model of reflective photo-mask 300, the aerial image, and/or the estimated photo-resist pattern are calculated for a set of mask patterns. In this way, one or more mask patterns that are compatible with or that can be used safely with a particular mask pattern in a reflective photo-mask corresponding to the model of reflective photo-mask 300, e.g., mask patterns that result in acceptable aerial images and/or estimated photo-resist patterns, can be identified. Alternative, such calculations can be used to identify which reflective photo-masks may require remedial action (such as repair or rework) if a defect, such as detect 322-1 occurs.

In an exemplary embodiment, after calculating absorption of incident light (such as a plane wave) by absorption layer 320-1, the Fourier transform of a near-field diffraction pattern associated with the two-dimensional mask pattern is used to calculate the contributions to the reflected light. In particular, the reflection by each discrete cell in multilayer stack 312 may be calculated using a closed-form expression that assumes each discrete cell is an infinite two-dimensional sheet (which is sometimes referred to as a 'parallel segments' model). However, other models, such as a finite difference time domain model, may be used. Then, the calculated contributions are summed to generate the Fourier transform of a near-field diffraction pattern reflected from multilayer stack 312. Next, absorption of this reflected light by absorption layer 320-1 is calculated, and the resulting reflect light from the model of reflect log photo-mask 300 is used in a lithographic simulator to determine one or more aerial images and/or estimated photo-resist patterns.

As noted previously, the modification calculated using the calculation technique may be used to repair a reflective photo-mask that includes at least one defect. For example, if the reflective photo-mask includes a pit or a scratch below a top surface of absorption layer 320-1, the material may be deposited or disposed immediately above the defect. This is shown in FIG. 4, which presents a block diagram illustrating a side view of multilayer defect compensation in reflective photo-mask 400. Because the pit introduces a phase delay $\Delta t$ equal to twice the pit depth d divided by the speed of light (i.e., $\Delta t = 2d/c$), material 410 at location 412 can be used to provide phase compensation. In particular, this material moves the phase forward when its index of refraction n is less than one because the speed of light in material 410 is reduced by $1/n$. Thus, the total phase delay (pit plus material 410) is $\Delta t = 2d(1-n)/c$. Therefore, material 410 may be chosen so that it has n less than one and the out-of-phase component k approximately zero. For example, material 410 may include carbon (with n equal to 0.9616 and k equal to −0.006905) with a thickness between 10 and 25 nm (depending on the size of defect 322-2). Note that, because the film or layer of material 410 absorbs a portion of the light, the pattern of absorption layer 320-1 may be changed to compensate the intensity (as described further below with reference to FIG. 6). Material 410 may approve the depth of focus and/or exposure margin of reflective photo-mask 400.

Figure 4:
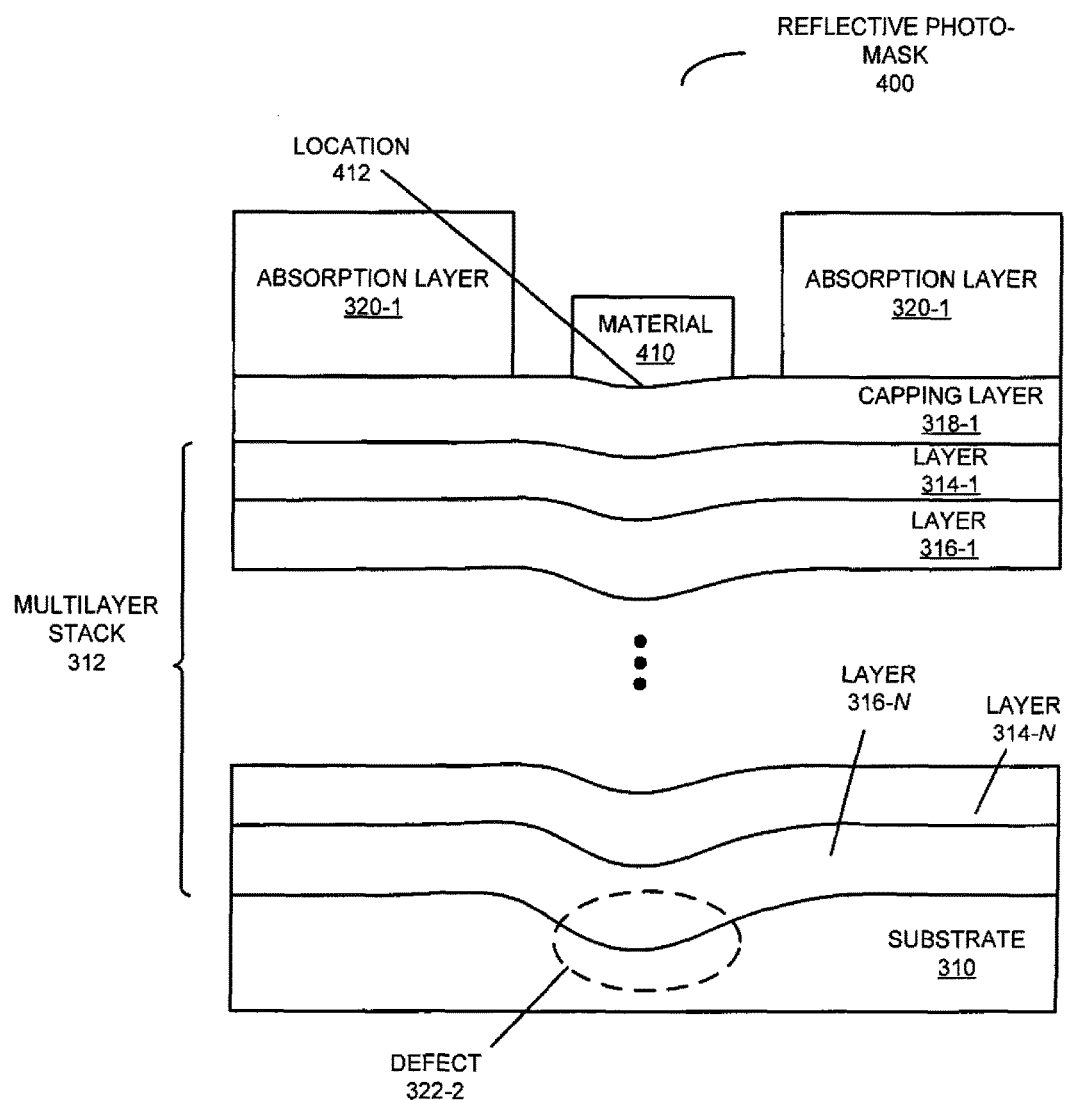
FIG. 4 is a block diagram, illustrating a side view of multilayer defect compensation in a reflective photo-mask in accordance with an embodiment of the present invention.
Figure 5A:
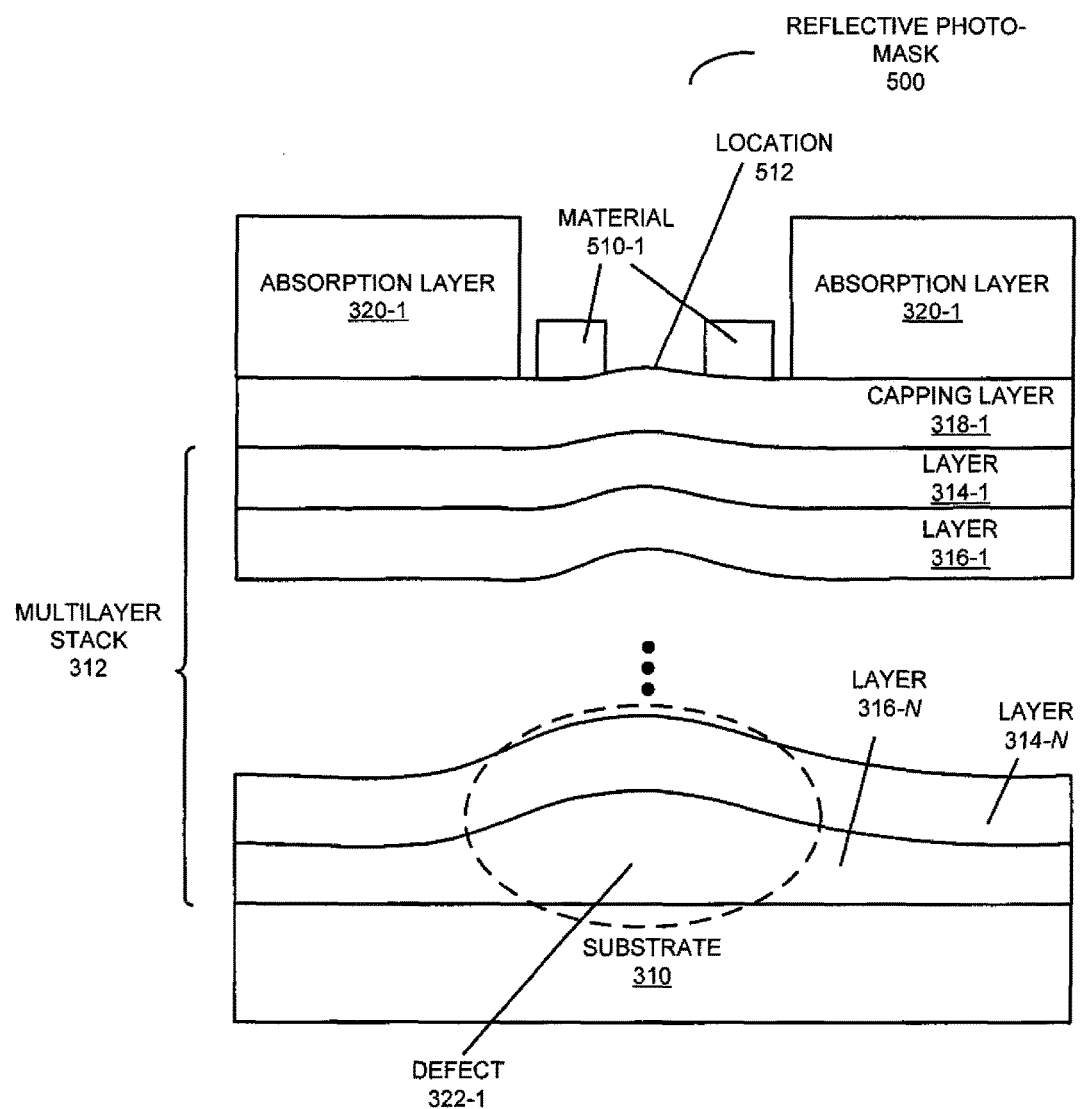
FIG. 5A is a block diagram illustrating a side view of multilayer defect compensation in a reflective photo-mask in accordance with an embodiment of the present invention.
Figure 5B:
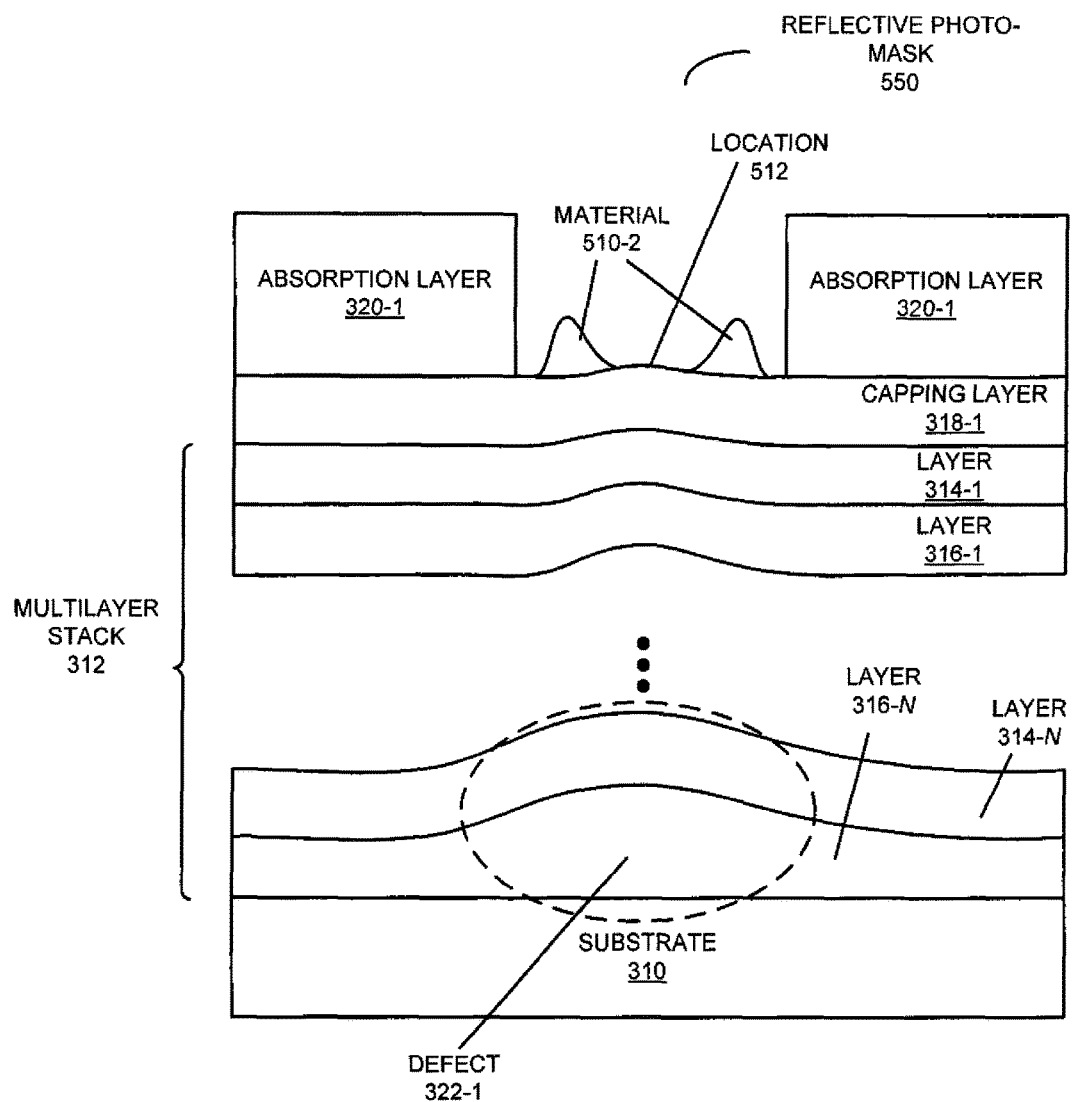
FIG. 5B is a block diagram illustrating a side view of multilayer defect compensation in a reflective photo-mask in accordance with an embodiment of the present invention.

If a material with n greater than, one and k approximately zero existed, the same configuration shown in FIG. 4 could be applied to a 'bump' defect. Otherwise, a different configuration may be used. In particular, if the reflective photo-mask includes a bump above a top surface of absorption layer 320-1, the material may be deposited or disposed in an annular shape that at least partially surrounds the defect. This is shown in FIG. 5A, which presents a block diagram illustrating a side view of multilayer defect compensation in reflective photo-mask 500. In this example, material 510-1 proximate to location 512 reduces the relative phase difference between adjacent locations proximate to location 512, i.e., the phase difference associated with defect 322-1 gradually decreases as a function of the radial distance from location 512. In an exemplary embodiment, material 510 has the shape of an annular ring with an inner diameter and an outer diameter centered on location 512. In some embodiments, material 510 may be shaped so that its profile is other than rectangular (for example, it may be shaped like a Fresnel lens). This is shown in FIG. 5B, which presents a block diagram illustrating a side-view of multilayer defect compensation in reflective photo-mask 550.

Note that, in general, when adding material 410 (FIG. 4), 510-1 (FIG. 5A) and/or 510-2, the modification to the reflective photo-mask may include the size, the thickness and the location of the additional material.

Figure 6:
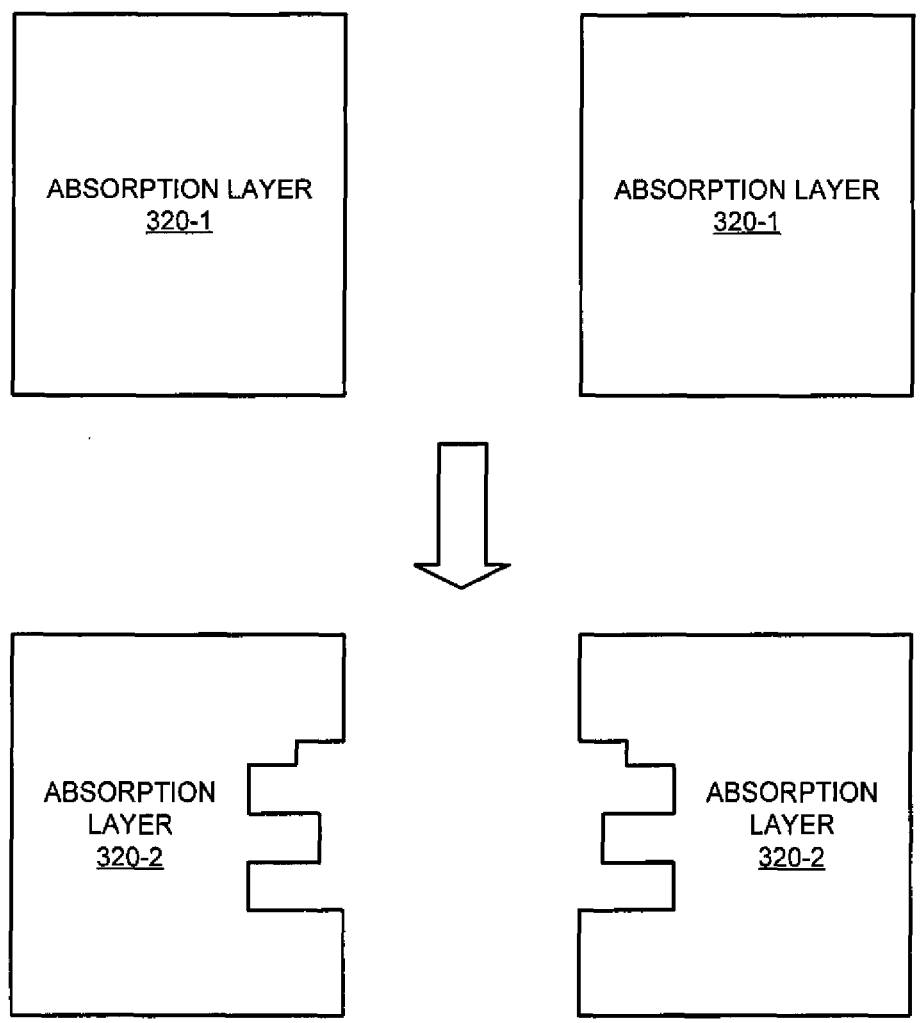
FIG. 6 is a block diagram illustrating a top view of multilayer defect compensation of an absorption layer in a reflective photo-mask in accordance with an embodiment of the present invention.

In addition to disposed the material on the top surface, as noted previously, in some embodiments the modification to the multilayer stack includes a change in a thickness of absorption layer 320-1 and/or a modification of the two-dimensional pattern of absorption layer 320-1 (i.e., a change in the shape of absorption layer 320-1). This is shown in FIG. 6, which presents a block diagram illustrating a top view of multilayer defect compensation of an absorption layer in a reflective photo-mask. In particular, using a forward optical calculation (such as that described in FIG. 7) and/or an inverse optical calculation (such as that described in FIG. 9) in which a desired output, such as a target pattern on a wafer, is used to determine the modification to the absorption layer based on an intervening optical path in a photolithographic process), one or more edges of absorption layer 320-1 may be displaced to generate absorption layer 320-2. For example, positions of the one or more edges may be changed by ±2 nm. Alternatively or additionally, the thickness of absorption layer 320-1 may be changed in at least a region of the reflective photo-mask. In general, the modifications to absorption layer 320-2 may correct for or reduce the impact of a defect (such as defect 322-1 in FIG. 3) on a resulting wafer pattern (such as the impact on a critical dimension or a threshold of a line) that is fabricated in a photolithographic process.

In an exemplary embodiment, absorption layer 320-1 has 88 nm dense lines (on the reflective photo-mask) and the light has a 6° angle of incidence. Furthermore, defect 322-1 (FIG. 3) may be 3 nm tall and may have a 65 nm full-width at half maximum. As shown in FIG. 3, defect 322-1 may be a defect on substrate 310, which results in vertical displacements of subsequent layers up to a surface of the reflective photo-mask. These vertical displacements may be centered 22 nm (on the reflective photo-mask) from an edge of absorption layer 320-1. Furthermore, the vertical displacements may be uniform from substrate 310 (FIG. 3) to the surface of the reflective photo-mask. Note that this reflective photo-mask may be used in a photolithographic process characterized by a numerical aperture of 0.32 and a source pattern with a sigma of 0.75.

Figure 7:
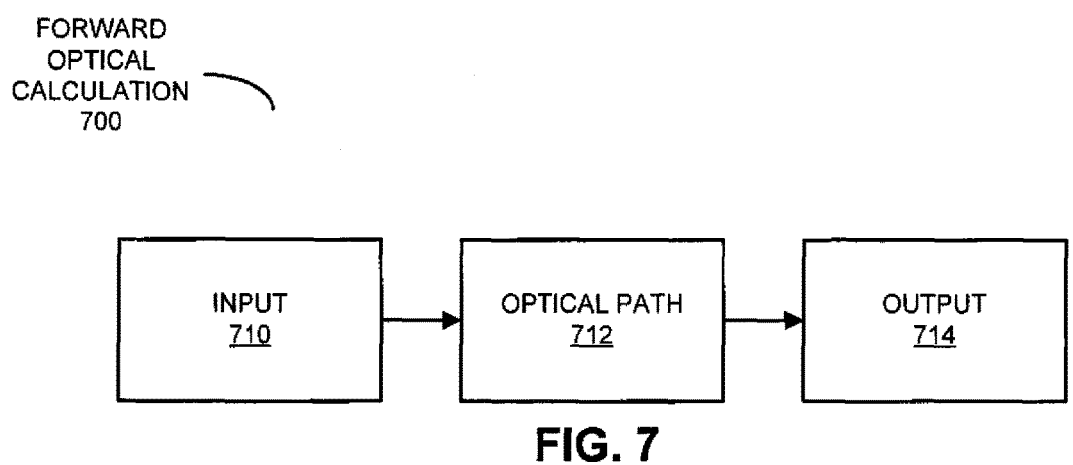
FIG. 7 is a block diagram illustrating a forward optical calculation in accordance with an embodiment of the present invention.

We now describe the forward optical calculation. FIG. 7 presents a block diagram illustrating a forward optical calculation 700. In this calculation, the reflected light (such as the reflected light provided by a reflective photo-mask when illuminated by a source pattern) is used as an input 710 at an object plane of optical path 712 to determine a predicted output 714 (such as a pattern or an image) at an image plane of optical path 712. For example, using the calculated reflected light from the reflective photo-mask (which is illuminated by a source pattern) and information about the optical path in an exposure tool, the aerial image can be determined.

Figure 8:
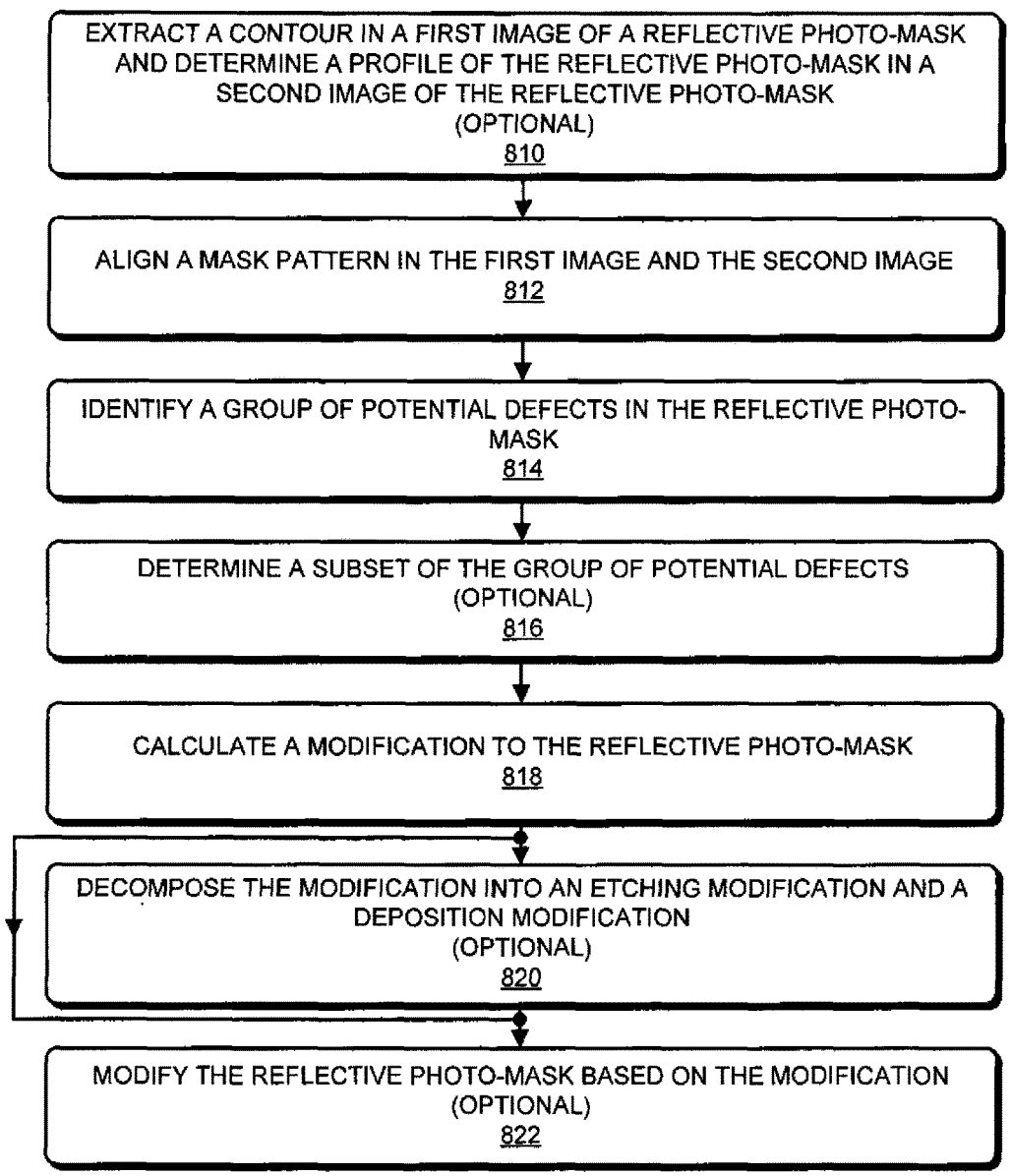
FIG. 8 is a flow chart illustrating a method for calculating a modification to a reflective photo-mask in accordance with an embodiment of the present invention.

We now describe another embodiment of the calculation technique. FIG. 8 presents a flow chart illustrating a method 800 for calculating a modification to a reflective photo-mask, which is performed by a computer system (such as computer system 1000 in FIG. 10). During operation, the computer system aligns a mask pattern in a first image of the reflective photo-mask and a second image of the reflective photo-mask (operation 812), where the first image and the second image correspond to different types of analysis techniques. For example, the first image may include a contour of the mask pattern corresponding to a scanning-electron-microscope image of the mask pattern of the reflective photo-mask and the second image may include a profile of the reflective photo-mask corresponding to atomic-force-microscope image of the reflective photo-mask. Moreover, prior to aligning the first image and the second image, the computer system may optionally extract the contour and may determine the profile (operation 810). In particular, a 3-dimensional profile may be obtained by extrapolating and subtracting a profile of the blank from a profile of the blank, the multilayer stack and the absorption layer.

Then, the computer system identifies a group of potential defects in the reflective photo-mask based on the aligned first and second images (operation 814). Note that identifying the group of potential defects may involve calculating an aerial image at the image plane in the photolithographic process. This may involve a forward optical calculation, such as that illustrated in FIG. 7. In some embodiments, after identifying the group of potential defects and prior to calculating the modification, the computer system optionally determines a subset of the group of potential defects that modify a wafer pattern to be produced using the reflective photo-mask in the photolithographic process (operation 816). For example, the subset may be those potential defects that 'print' or modify an aerial image or a wafer pattern at an image plane in the photolithographic process.

Next, the computer system calculates the modification to the reflective photo-mask (such as a modification to the mask pattern in an absorption layer in the reflective photo-mask and/or selectively adding a layer of the material on the top surface of the reflective photo-mask in proximity to a defect) based on at least the subset of the group of potential defects using an inverse optical calculation (operation 818). In particular, during the inverse optical calculation, a cost function at an image plane in a model of the photolithographic process is used to determine the modification to the reflective photo-mask at an object plane in the model of the photolithographic process. This cost function corresponds to a difference between a reference pattern associated with a target mask pattern and a calculated pattern associated with a modified reflective photo-mask. For example, the cost function may include a magnitude of the difference to the nth power (such as the magnitude squared), where n can be a real number. Note that the modified reflective photo-mask includes the modification to the reflective photo-mask determined in a previous iteration during the inverse optical calculation.

Furthermore, the inverse optical calculation may include a constrained inverse optical calculation in which the modification is restricted to discrete values, such as those corresponding to an etching step size and an etching pixel size and/or a deposition step size and a deposition pixel size used when modifying the reflective photo-mask. Note that the constrained inverse optical calculation may be 'biased' to prefer either an etching modification or a deposition modification to the reflective photo-mask. For example, in some embodiments only etching is allowed or etching is preferred to deposition. Note that deposition accuracy (in terms of deposition pixel size and the deposition step size) may be looser than the etching accuracy (i.e., the deposition pixel size is larger than the etching pixel size and/or the deposition step size is larger than the etching step size).

In some embodiments, the reference pattern includes a reference aerial image at the image plane and the calculated pattern includes an aerial image at the image plane. (Thus, the cost function may correspond to the difference of at least two aerial images.) Alternatively or additionally, the reference pattern may include a reference contour at the image plane and the calculated pattern may include a contour at the image plane.

Moreover, the reference pattern and the calculated pattern may correspond to a set of process conditions during the photolithographic process, such as different focal conditions and/or different exposure latitudes. In these embodiments, the cost function may include different weights for different process conditions in the set of process conditions. For example, the nominal focus and/or exposure latitude may have a weight of 1 while other process conditions may have smaller weights.

In some embodiments, prior to modifying the reflective photo-mask, the computer system may optionally decompose the modification into an etching modification to the reflective photo-mask and a deposition modification to the reflective photo-mask (operation 820). Additionally, after calculating the modification, the computer system optionally modifies the reflective photo-mask based on the calculated modification (operation 822). Note that this operation may include providing instructions to a user (who performs the modification) and/or a photo-mask repair system (which performs the modification). For example, the photo-mask repair system may include an electron-beam repair tool provided by Carl Zeiss AG (of Oberkochen, Germany). Moreover, modifying the reflective photo-mask may involve etching the reflective photo-mask and/or depositing a material on the reflective photo-mask.

In some embodiments, the computer system may generate a target scanning-electron-microscope image based on the target mask pattern. Moreover, a scanning-electron-microscope image may be generated based on the modified reflective photo-mask (which includes the modification), and the two scanning-electron-microscope images may be compared.

In some embodiments of method 800 there may be additional or fewer operations. Moreover, the order of the operations may be changed, and/or two or more operations may be combined into a single operation.

Figure 9:
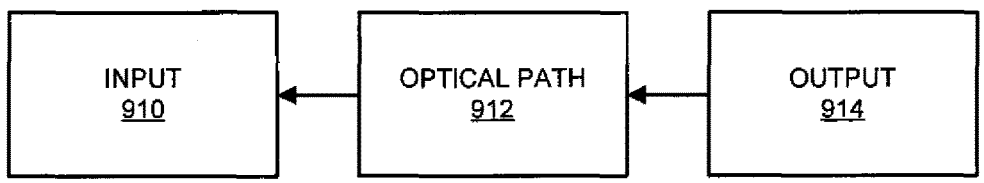
FIG. 9 is a block diagram illustrating an inverse optical calculation in accordance with an embodiment of the present invention.

We now describe the inverse optical calculation. FIG. 9 presents a block diagram illustrating an inverse optical calculation 900. In this calculation, a predicted input 910 (such as a predicted modified mask pattern in the reflective photo-mask) at an object plane of optical path 912 is determined based on an output 914 (such as a target wafer pattern or the cost function) at an image plane of optical path 912. For example, the modified mask pattern at the object plane may be determined from the cost function at the image plane and information about the optical path in an exposure tool. Note that information about optical path 912 may include the characteristic of optical path 912, such as an optical bandwidth of optical path 912.

While the preceding discussion illustrates the inverse optical calculation using a single output 914, in other embodiments multiple patterns or images at image plane(s) of optical path 912 may be used. For example, instead of the calculated pattern, there may be a set of calculated patterns that are each determined using different wavelengths, different focal conditions (e.g., on different focal surfaces or planes), and/or different imaging conditions in the exposure tool. These patterns may include magnitude and/or phase information. Furthermore, in some embodiments each of the patterns at the image plane(s) used in the inverse optical calculation 900 or a term(s) including some combination of the patterns at the image plane(s) may be multiplied by a corresponding weight. In this way, inverse optical calculation 990 may emphasize one or more of the patterns at the image plane relative to other patterns (at the same or other image planes) used in inverse optical calculation 900.

In some embodiments, inverse optical calculation 900 is based on iterative minimization of a cost function (H), which is also sometimes referred to as an 'error function' or a 'Hamiltonian function.' In particular, during each iteration of inverse optical calculation 900 the cost function may be a function of the difference between output 914 and a pattern (or image) that results when input 910 is projected through optical path 912. In some embodiments, input 910 initially corresponds to the target mask pattern, and as the calculation progresses this pattern is allowed to evolve while output 914 is held constant (subject to the constraints that there are a finite number of discrete steps sizes or pixel sizes).

In embodiments with multiple patterns (or images) at object plane(s) and/or image plane(s), the cost function (H) equals $$\sum_{j=1}^{N} w_j |I_j - I_{oj}|^n,$$

where $I_j$ is the forward projection of the jth modified mask pattern at the object plane (out of N patterns in this example) through optical path 912, $w_j$ is a corresponding weight, $I_{oj}$ is the jth target image at an image plane, and n is a power. Note that the cost function (H) approaches zero as $I_j$ approaches $I_{oj}$.

In an exemplary embodiment, N is 3 and n is 2. Three patterns (or patterns) at the image plane(s) may be determined at three different local conditions (or focus settings) in the exposure tool. For example, with a wavelength of 260 nm, the focal conditions may be at −600 nm (relative to nominal locus), at 0 nm (i.e., at nominal focus), and 600 nm (relative to nominal focus). Alternatively or in addition, the three patterns (or images) at the image plane(s) may be determined at three different wavelengths or imaging conditions. Furthermore, a corresponding set of weights $\{w_j\}$ may be 1, 0.1, and 1.

In other embodiments, the weights are varied as inverse optical calculation 900 progresses and/or different weights are used for specific parts (or even pixels) of a pattern. For example, the weights may be determined based on the difference between $I_j$ and $I_{oj}$ at a given step or iteration in inverse optical calculation 900. This approach may exaggerate the features or defects, especially when, inverse optical calculation 900 is close to a local or global minimum and the cost function (H) corresponds to small differences. Thus, in general the cost function (H) may be expressed as a double integral over the pattern or image area and there may be separate time-dependent weights for $I_j$ and $I_{oj}$. Furthermore, in some embodiments the cost function (H) is expressed as a relative difference between $I_j$ and $I_{oj}$ for at least a portion of inverse optical calculation 900 as it progresses.

It will be recognized by one of ordinary skill in the art that inverse optical calculation 900 described above is poorly defined. In particular, numerous possible modified mask patterns at the object plane may result from the same observed output 914. Therefore, input 910 may be selected such that it is 'most likely' to represent the target mask pattern. A variety of constraints and additional criteria may be imposed when determining the solution(s) to this problem in order to find a unique answer(s). For example, input 910 may be that which has the smallest value of the cost function (H).

Note that optical path 912 may be different than optical path 712 (FIG. 7). In general, information about optical paths 712 (FIG. 7) and/or 912 may include some or all of the aspects of the photolithographic process, such as: illumination settings, the electromagnetics of the photo-mask, the exposure-tool optics, etc. In addition, in some embodiments forward optical calculation 700 (FIG. 7) and/or inverse optical calculation 900 model the effect of a photoresist, including flare and/or etch effects.

The calculations corresponding to one or more optical paths in forward optical calculation 700 (FIG. 7) and/or inverse optical calculation 900 may be implemented using Fourier-optical techniques. Furthermore, the optical path in forward optical calculation 700 (FIG. 7) and/or inverse optical calculation 900 may include multiple models of optical paths (such as in a multiple-exposure photolithographic process). Also note that while optical path 712 (FIG. 7) and optical 912 have, respectively, been traversed in a particular direction, these optical paths may be traversed in either direction.

Furthermore, note that forward optical calculation 700 (FIG. 7) and/or inverse optical calculation 900 may take into account, by way of example but not limitation, various illumination conditions (e.g., off-axis, incoherent), the actual electromagnetics of the light field interacting with the reflective photo-mask, aberrations in optical paths 712 (FIG. 7) and/or 912, and/or the vector nature of the electromagnetic field as it propagates through optical paths 712 (FIG. 7) and/or 912. In some embodiments, aspects of forward optical calculation 700 in FIG. 7 (such us the mask pattern) and/or inverse optical calculation 900 are represented using one or more level-set functions. Furthermore, in some embodiments, forward optical calculation 700 (FIG. 7) and/or inverse optical calculation 900 are divided into a series of overlapping sub-problems (also referred to as 'work units'), at least some of which are processed independently and/or concurrently. These work units may be based on elements or structures (for example, repetitive structures) in the mask pattern and/or the target pattern. For example, the work units may be between 10,000 nm$^2$ and 100 μm$^2$ in size.

We now describe an exemplary embodiment of the forward optical calculation or forward projection operation used to calculate the aerial image, the contour and/or the estimated resist pattern. For simplicity, coherent illumination of the reflective photo-mask is utilized. Furthermore, the electric field falling upon the reflective photo-mask is approximately constant. Thus, the clear regions of the reflective photo-mask reflect the light, while the opaque regions absorb the light. It follows that a scalar electric field E illuminating the reflective photo-mask may be expressed as $$E(\bar{r}) = \begin{cases} 0 & \text{absorption} \\ 1 & \text{non-absorption} \end{cases},$$

where $\bar{r}=(x,y)$ is a point on the (x,y) plane. In some embodiments, this representation of the reflective photo-mask may be re-expressed using a function φ (referred to as a level-set function) having positive regions that indicate absorption regions and negative regions that indicate non-absorption regions. (More generally, the level-set function may represent the reflective photo-mask using two or more levels,) furthermore, the level-set function may equal zero at the boundaries or contours of the reflective photo-mask. Therefore, the electric field E associated with the reflective photo-mask may be re-expressed as a function of this level-set function, i.e., $$E(\bar{r}) = \hat{h}(\phi(x,y)),$$

where $\hat{h}$ is the Heaviside function $$\hat{h}(x) = \begin{cases} 1 & x \geq 0 \\ 0 & x < 0 \end{cases}.$$

Since an ideal diffraction limited lens acts as a low-pass filter, this may be used as an approximation to the actual (almost but not quite perfect) optical component(s) in the optical path of the exposure tool (in this example). Mathematically, the action of the optical component(s) may be expressed as $$A(\bar{r}) = f^{-1}(\bar{C}(f(E(\bar{r}))))$$

where $A(\bar{r})$ indicates the electric field distribution on the water, $f$ indicates the Fourier transform, $f^{-1}$ indicates the inverse Fourier transform, and $\bar{C}$ indicates the pupil cutoff function, which is zero for frequencies larger than a threshold determined by the numerical aperture of the optical component(s), and one otherwise. Thus, the pupil function is $$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases},$$

wherein $k_x$, $k_y$ and $k_{max}$ represent frequency coordinates in Fourier space. Therefore, the aerial image (at the wafer in the exposure tool) is simply the square of the electric field $$I(\bar{r}) = |A(\bar{r})|^2.$$

Combining these two equations, we find $$F(\phi(x, y)) = (|f^{-1}(\bar{C}(f(\hat{h}(\phi(x, y)))))|^2).$$

This is a self-contained formula for the aerial image obtained by the exposure tool.

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the reflective photo-mask, various types of reflective photo-masks, the polarization of the light field, the actual properties of the optical component(s) (such as aberrations), and/or the vector nature of the electromagnetic field as it propagates through the optical path.

In some embodiments, during each iteration of inverse optical calculation 900 the level-set function corresponding to input 910 being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the cost function. In an exemplary embodiment, $\nabla(H)$ is $$\left.\frac{\delta H}{\delta \phi}\right|_{\varphi_i},$$

i.e., it is the Frechet derivative of the cost function H. Furthermore, in some embodiments ∇(H) is the direction of steepest descent for minimizing or optimizing H by changing φ. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse optical calculation 900. In particular, the cost function H may be allowed to increase during some steps as the calculation evolves. In this way, the global minimum in the multi-dimensional space may be determined. Note that the size of this multi-dimensional space may be a number of quantization levels to the power of the number of pixels in the modified mask pattern. In an exemplary embodiment, the modified mask pattern or image has at least 1 million pixels (for example, 1024× 1024).

In one embodiment, in any iteration of inverse optical calculation 900, changes in φ that decrease or increase the cost function (H) up to 0.5% are performed. If a larger change will result (e.g., ΔH>0.5%), the step size Δt may be decreased by a factor that is at least greater than 1 and the change in φ is implemented (or not) based on a probability and a value P given by $$e^{\frac{-kH_{i+1}}{H_i}},$$

where $H_{i-1}$ is the cost function in the i+1$^{th}$ iteration (if the change in φ is implemented) and $H_i$ is the cost function in i$^{th}$ iteration (note that the ratio of $H_{i+1}/H_i$ equals 1+ΔH). In some embodiments k is 0.155. For example, if the value P is 0.3 and the probability is a random (or pseudorandom) number between 0 and 1 that is less than P, the coat function may be increased before proceeding. In this way, inverse optical calculation 900 initially takes large steps and thereby explores the solution space.

In some embodiments, inverse optical calculation 900 is run for 100, 1000 or 10,000 iterations at which point the optimal solution has been determined. In other embodiments, the calculation is stopped based on convergence criteria, such as oscillatory behavior, a relative and/or absolute difference between the inspection image and images that result when the reconstructed mask pattern is projected through optical path 912, the latest change to the cost function H, and/or the history of changes to the cost function H. For example, the relative difference may be less than 1% and/or the absolute difference may be 10 nm for a critical dimension of 100 nm. Note that in some embodiments, the level-set function is re-distanced (i.e., restored to one having a distance function property relative to an edge or contour in the mask pattern) at intermediate iterations during inverse optical calculation 900. In an exemplary embodiment, such re-distancing occurs at least every 20 iterations (for example, every 14 iterations).

Figure 10:
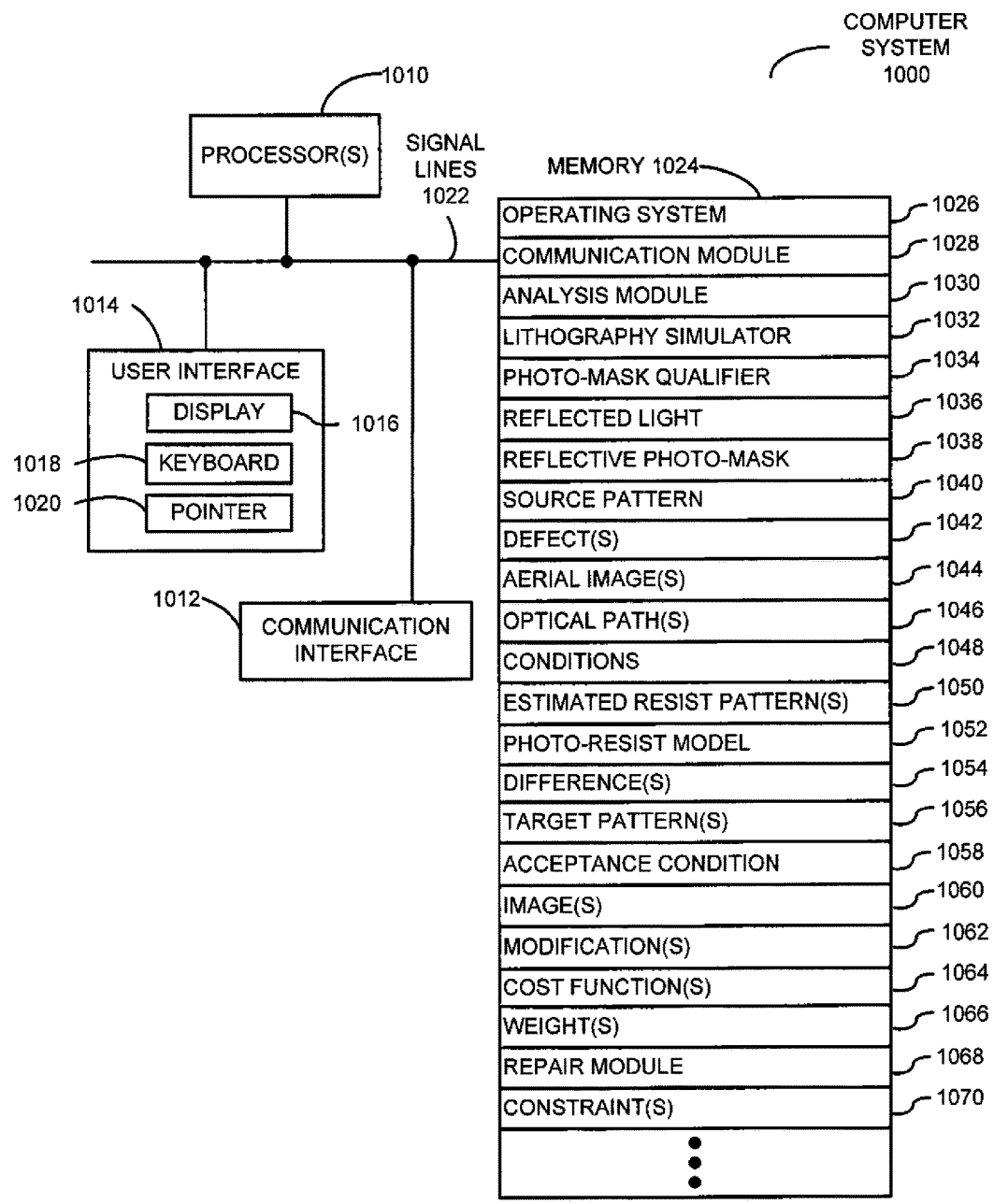
FIG. 10 is a block diagram illustrating a computer system in accordance with an embodiment of the present invention.

We now discuss computer systems for implementing the calculation technique. FIG. 10 presents a block diagram illustrating a computer system 1000. Computer system 1000 includes one or more processors 1010, a communication interface 1012, a user interface 1014, and one or more signal lines 1022 coupling these components together. Note that the one or more processing units 1010 may support parallel processing and/or multi-threaded operation, the communication interface 1012 may have a persistent communication connection, and the one or more signal lines 1022 may constitute a communication bus. Moreover, the user interface 1014 may include a display 1016, a keyboard 1018, and/or a pointer 1020, such as a mouse.

Memory 1024 in the computer system 1000 may include volatile memory and/or non-volatile memory. More specifically, memory 1024 may include ROM, RAM, EPROM, EEPROM, flash, one or more smart cards, one or more magnetic disc storage devices, and/or one or more optical storage devices. Memory 1024 may store an operating system 1026 that includes procedures (or a set of instructions) for handling various basic system services for performing hardware dependent tasks. The memory 1024 may also store procedures (or a set of instructions) in a communication module 1028. The communication procedures may be used for communicating with one or more computers and/or servers, including computers and/or servers that are remotely located with respect to the computer system 1000.

Memory 1024 may also include multiple program modules (or a set of instructions), including: analysis module 1030 (or a set of instructions), lithography simulator 1032 (or a set of instructions), photo-mask qualifier 1034 (or a set of instructions), and/or repair module 1068 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software and/or software in a photo-mask repair system.

During operation of computer system 1000, analysis module 1030 may determine reflected light 1036 from a model of a reflective photo-mask 1038 based on a source pattern 1040 that illuminates reflective photo-mask 1038. This model of the reflective photo-mask may include one or more defects 1042.

Next, lithography simulator 1032 may calculate one or more aerial image(s) 1044 in a forward optical calculation using reflected light 1036 and information about one of optical paths 1046. This calculation may also use photo-lithographic conditions 1048. Furthermore, lithography simulator 1032 may calculate estimated resist pattern(s) 1050 using one or more aerial image(s) 1044 and a photo-resist model 1052.

After these calculations are performed, photo-mask qualifier 1034 may identify a difference(s) 1054 (or features) between aerial image(s) 1044 and/or estimated resist pattern(s) 1050 and target or reference pattern(s) 1056 (such as portions of a circuit), and may determine an acceptance condition 1058 of the reflective photo-mask based on the identified difference(s) 1054.

Alternatively or additionally, during operation of computer system 1000 analysis module 1030 may optionally extract a contour of a mask pattern in a reflective photo-mask from one of images 1060 and/or may optionally determine a profile of the reflective photo-mask. Moreover, analysis module may align the mask pattern associated with the extracted contour and the determined profile.

Using the aligned information, analysis module 1030 may identify one or more potential defects 1042 in the reflective photo-mask, for example, based on a comparison with one or more target patterns(s) 1056 (such as a target mask pattern). Moreover, lithography simulator 1032 may calculate one or more aerial images 1044 (or contours) and/or estimated resist patterns 1050 using a forward optical calculation, and a subset of the one or more potential defects 1042 may be determined by analysis module 1030 based on a subsequent comparison with one or more target patterns(s) 1056. This subset may include those detects that 'print' during the photolithographic process.

Next, analysis module 1030 may calculate one or more modification(s) 1062 to a mask pattern in reflective photo-mask 1038 based an inverse optical calculation performed by lithography simulator 1032 using reflected light 1036, information about one of optical paths 1046, and at least the subset of the one or more potential defects 1042. As noted previously, the inverse optical calculation may be a constrained inverse optical calculation and may be based on one or more cost function(s) 1064 and one or more constraints 1070. Furthermore, the cost function(s) 1064 may be determined during the inverse optical calculation using one or more weight(s) 1066, which may correspond to different process conditions 1048 in the photolithographic process.

The one or more modification(s) 1062 may be used to modify or repair reflective photo-mask 1038. For example, information or instructions associated with the one or more modification(s) 1062 may be provided by computer system 1000 to a photo-mask repair system. Alternatively, repair module 1068 may modify reflective photo-mask 1038 based on the one or more modification(s) 1062. In some embodiments, prior to modifying reflective photo-mask 1038, analysis module 1030 decomposes the one or more modification(s) 1062 into an etching modification to reflective photo-mask 1038 and/or a deposition modification to reflective photo-mask 1038.

Instructions in the various modules in memory 1024 may be implemented in a high-level procedural language, an object-oriented programming language, and/or in an assembly or machine language. The programming language may be compiled or interpreted, i.e., configurable or configured to be executed, by the one or more processing units 1010.

In some embodiments, at least some of the information in memory 1024 is encrypted. For example, the lithographic simulator 1032 and/or its output files (such as estimated resist Pattern(s) 1050) may be encrypted. Furthermore, information 'stored' in memory 1024 in FIG. 10 may be stored locally and/or at remote locations.

Although the computer system 1000 is illustrated as having a number of discrete items, FIG. 10 is intended to be a functional description of the various features that may be present in the computer system 1000 rather than as a structural schematic of the embodiments described herein. In practice, and as recognized by those of ordinary skill in the art, the functions of the computer system 1000 may be distributed over a large number of servers or computers, with various groups of the servers or computers performing particular subsets of the functions. In some embodiments, some or all of the functionality of the computer system 1000 may be implemented in one or more ASICs, one or more field programmable gate arrays (FPGAs), and/or one or more digital signal processors (DSPs). In some embodiments the functionality of the computer system 1000 may be implemented more in hardware and less in software, or less in hardware and more in software, as is known in the art.

In the preceding discussion, a 'computer system' may include a variety of devices, such as: a personal computer, a laptop computer, a tablet computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, the model of reflective photo-mask 300 (FIG. 3), reflective photo-mask 400 (FIG. 4), reflective-photo-mask 500 (FIG. 5A), reflective photo-mask 550 (FIG. 5B), forward optical calculation 700 (FIG. 7) inverse optical calculation 900 (FIG. 9), and/or computer system 1000 include fewer or additional components. For example, instead of annular rings at least partly surrounding locations 512 in FIGS. 5A and 5B, in some embodiments material 510-1 or 510-2 may be deposited proximate to locations 512 and between lines in a pattern in absorption layer 320-1. Thus, material 510-1 or 510-2 may have a rectangular shape with a rectangular gap proximate to locations 512. Furthermore, in these embodiments two or more components may be combined into a single component and/or a position of one or more components may be changed.

In the preceding description, we refer to "some embodiments." Note that "some Embodiments" describes a subset of all of the possible embodiments, but does not always specify the same subset of embodiments.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for calculating a modification to a reflective photo-mask, comprising:
   receiving information specifying a defect underneath a top surface of the reflective photo-mask and associated with at least a location on the top surface of the reflective photo-mask; and
   using the computer, calculating the modification to the reflective photo-mask for correcting the defect, wherein the modification includes adding a material to the top surface of the reflective photo-mask using an additive fabrication process.

2. The method of claim 1, wherein the calculating involves an inverse optical calculation in which a difference between a pattern associated with the reflective photo-mask at an image plane in a photo-lithographic process and a reference pattern at the image plane in the photo-lithographic process is used to calculate the modification at an object plane in the photo-lithographic process.

3. The method of claim 1, wherein the defect includes a phase error.

4. The method of claim 1, wherein the receiving involves identifying the defect.

5. The method of claim 1, wherein the material includes carbon.

6. The method of claim 1, wherein the modification further includes defining a pattern in an absorption layer in the reflective photo-mask using a subtractive fabrication process.

7. The method of claim 1, wherein the modification increases a margin in a photo-lithographic process that uses the reflective photo-mask.

8. A computer-program product for use in conjunction with a computer system, the computer-program product comprising a non-transitory computer-readable storage medium and a computer-program mechanism embedded therein to calculate a modification to a reflective photo-mask, the computer-program mechanism including:
instructions for receiving information specifying a defect underneath a top surface of the reflective photo-mask and associated with at least a location on the top surface of the reflective photo-mask; and
instructions for calculating the modification to the reflective photo-mask for correcting the defect, wherein the modification includes adding a material to the top surface of the reflective photo-mask using an additive fabrication process.

9. The computer-program product of claim 8, wherein the calculating involves an inverse optical calculation in which a difference between a pattern associated with the reflective photo-mask at an image plane in a photo-lithographic process and a reference pattern at the image plane in the photo-lithographic process is used to determine the modification at an object plane in the photo-lithographic process.

10. The computer-program product of claim 8, wherein the defect includes a phase error.

11. The computer-program product of claim 8, wherein the material includes carbon.

12. The computer-program product of claim 8, wherein the modification further includes defining a pattern in an absorption layer in the reflective photo-mask using a subtractive fabrication process.

13. A computer system, comprising:
at least one processor;
at least one memory; and
at least one program module, the program module stored in the memory and configured to be executed by the processor to calculate a modification to a reflective photo-mask for correcting a defect, the program module including:
instructions for receiving information specifying a defect underneath a top surface of the reflective photo-mask and associated with at least a location on the top surface of the reflective photo-mask; and
instructions for calculating the modification to the reflective photo-mask, wherein the modification includes adding a material to the top surface of the reflective photo-mask using an additive fabrication process.

14. The computer system of claim 13, wherein the calculating involves an inverse optical calculation in which a difference between a pattern associated with the reflective photo-mask at an image plane in a photo-lithographic process and a reference pattern at the image plane in the photo-lithographic process is used to determine the modification at an object plane in the photo-lithographic process.

15. The computer system of claim 13, wherein the defect includes a phase error.

16. A reflective photo-mask, comprising:
a substrate;
a multilayer stack disposed on the substrate;
an absorption layer disposed on a top surface of the multilayer stack; and
another material added to the reflective photo-mask by an additive fabrication process after a defect was found underneath a top surface on the reflective photo-mask, wherein the other material is added proximate to a location on the top surface of the reflective photo-mask, and wherein the location is associated with the defect in the reflective photo-mask and wherein such defect is corrected by such other material.

* * * * *